United States Patent
Petty

[11] Patent Number: 6,138,246
[45] Date of Patent: Oct. 24, 2000

[54] DUAL CLOCK SIGNAL GENERATING CIRCUIT

[75] Inventor: John S. Petty, Chapel Hill, N.C.

[73] Assignee: Ericsson Inc., Research Triangle Park, N.C.

[21] Appl. No.: 09/224,529

[22] Filed: Dec. 31, 1998

[51] Int. Cl.[7] ..................................................... G06F 1/04
[52] U.S. Cl. ........................ 713/500; 327/299; 331/49
[58] Field of Search ................................. 713/500, 501; 326/93; 327/100, 144, 146, 155, 291, 299; 331/46, 49, 175

[56] References Cited

U.S. PATENT DOCUMENTS

| | | | |
|---|---|---|---|
| 4,101,838 | 7/1978 | Aihara et al. | 327/115 |
| 4,910,703 | 3/1990 | Ikeda et al. | 364/900 |
| 5,369,377 | 11/1994 | Benhamida | 331/49 |
| 5,550,489 | 8/1996 | Raab | 326/93 |
| 5,929,713 | 7/1999 | Kubo et al. | 331/49 |

FOREIGN PATENT DOCUMENTS

| | | |
|---|---|---|
| 197 26 639A1 | 12/1998 | Germany . |
| 57002130 | 1/1982 | Japan . |
| 62111503 | 5/1987 | Japan . |
| 05075342 | 3/1993 | Japan . |

*Primary Examiner*—Thomas M. Heckler
*Attorney, Agent, or Firm*—Coats & Bennett, PLLC

[57] ABSTRACT

A clock circuit includes a clock signal generator for generating a first clock signal during a normal mode of operation and an oscillating dual clock generating circuit for producing a second clock signal during a second mode of operation. The oscillating dual clock generating circuit is connected to the output of the clock signal generator. In the first mode of operation, the clock signal from the clock signal generator is passed through the oscillating dual clock generating circuit to a control device. In a second mode of operation, the input of the oscillating research signal is isolated. Isolation of the oscillating dual clock generating circuit causes oscillation in the dual clock generating circuit. Thus, the dual clock generating circuit acts as an oscillator during the second mode of operation to generate a second clock signal.

25 Claims, 3 Drawing Sheets

DUAL CLOCK SIGNAL GENERATING CIRCUIT

FIELD OF THE INVENTION

The present invention relates generally to clock signal generating circuits for microprocessors, digital signal processors, and other circuits requiring a clock signal for operation and, more particularly, to dual clock generating circuits having a single oscillator.

BACKGROUND OF THE INVENTION

The use of a clock circuit to provide a frequency reference is well known in the art. Most complex circuits require a frequency reference to advance the state of digital processors and other synchronous electronic circuits. For example, clock signals are used in digital cellular telephones, computers, computer peripherals, digital instruments, and a host of other devices too numerous to mention. Many complex electronic circuits, including micro-processors, micro-controllers, digital signal processors (DSP) and other digital or synchronous circuits, require an active clock input during reset to set their internal logic to a known initial state. In some circuits, the failure to provide sufficient clock pulses during reset can result in an incompletely initialized circuit, needlessly drawing excessive current during and after reset. The output of such circuits could also exit reset in an unknown state, potentially causing erroneous system behavior where those outputs control other circuits and devices.

Many complex electronic devices use more than one processor, each of which requires a clock signal, often at different frequencies. One example is a digital cellular telephone, which requires a clock signal for both the micro-controller and the digital signal processor in the phone. This problem is not unique to digital cellular telephones, but can arise in many other electronic devices having multiple processors. When faced with a circuit design that has multiple processors, there is frequently a question about the number of oscillators to use.

One solution to the multiple clock problem is to provide a dedicated oscillator for the micro-controller and DSP. However, dedicating an oscillator or frequency reference to both the micro-controller and DSP is expensive, consumes space, consumes more power than single oscillator designs, and makes power management by clock gating more difficult. In addition, multiple clocks present potential problems with clock synchronization and harmonic interference that may require specialized circuit layout techniques, such as dedicated ground planes and careful physical partitioning of circuits connected to each clock net.

Another solution is to route the clock signal from a single clock source to multiple processors. This approach may require buffers and may require the clock signal to be routed over long distances. In general, it is considered good practice to keep signals localized whenever possible to minimize the spread of switching harmonics through a system. Also, this approach is undesirable in some circuits that use a micro-controller that is periodically reset because it requires the clock to remain active during reset. During reset, that oscillator may draw a substantial amount of current. This is not desirable for battery powered devices.

Many micro-controller circuits attempt to facilitate the use of a single oscillator in the system by accepting a high frequency input and providing the same frequency clock output, or a synchronized, lower frequency version of the clock at the output of the micro-controller, for use by other circuits in the system. However, many of these micro-controllers do not provide the clock outputs during reset. To provide the requisite clock signal to other circuits in the system during reset, multiple oscillators are required. This solution is costly, wastes valuable system component space, and consumes more power than a single oscillator solution.

Accordingly, there remains a need for a simple, low-cost clock circuit that uses a single clock network that can provide a clock signal during reset that is required by circuits requiring a clock signal for initialization.

SUMMARY OF THE INVENTION

The present invention is a dual clock generating circuit for a processor, DSP, or other circuit requiring a clock signal during reset for initialization. The clock signal generating circuit comprises a clock signal generator for producing a first clock signal, and a synchronizing oscillator circuit connected in series with the clock signal generator for producing a second clock signal. The clock signal generator produces a first clock signal during a normal mode of operation. The first clock signal output from the clock signal generator is applied to the synchronizing oscillator circuit which passes the first clock signal essentially unchanged during the normal mode. When the signal from the clock signal generator is suppressed or blocked, as will occur during reset, the input of the synchronizing oscillator circuit is isolated. When this occurs, the synchronizing oscillator circuit will behave like an oscillator to generate the second clock signal. Thus, the synchronizing oscillator circuit becomes, in effect, a secondary clock generating circuit when the clock signal generator is disabled.

The present invention is particularly useful where the clock signal generator is a micro-controller having a clock output for producing a clock signal used by another circuit or processor. In many micro-controllers, the clock output is shut-off during reset. The synchronizing oscillator circuit connected to the clock output of the micro-controller can function as a secondary clock generator to generate a second clock signal during the reset period. Thus, the present invention avoids the need for a separate oscillator to provide the secondary clock signal.

The clock circuit of the present invention is also useful for power management where the clock signal generator draws a substantial amount of current. There may be periods of time when the main clock can be shut off for power management reasons. The present invention can be used to generate a secondary clock signal during the periods when the main clock is shut off to save energy.

The present invention has several advantages. It allows a single oscillator to be used as a frequency reference for multiple processors. Particularly at higher frequencies and in low power systems, such as battery-powered devices, a single clock design is preferred. A single oscillator reduces cost, space, and power consumption requirements, and it eliminates the frequency accuracy, harmonic interface, and clock synchronization problems inherent in multiple oscillator designs. The processors can remain time locked during normal operation. The main clock can be disabled during reset thereby saving power.

Another advantage is that the present invention allows the clock distribution to be serial rather than some form of tree-structure. This results in shorter length in printed circuit board wiring dedicated to clock distribution. For a system that has multiple clock sources for other reasons, the present invention eliminates the need to route secondary clock signals out of their normal area of operation.

Finally, the clock circuit of the present invention lends itself nicely to being integrated into an ASIC and requires no additional pins if the ASIC was already used for clock distribution.

DETAILED DESCRIPTION OF THE DRAWINGS

Figure 1:
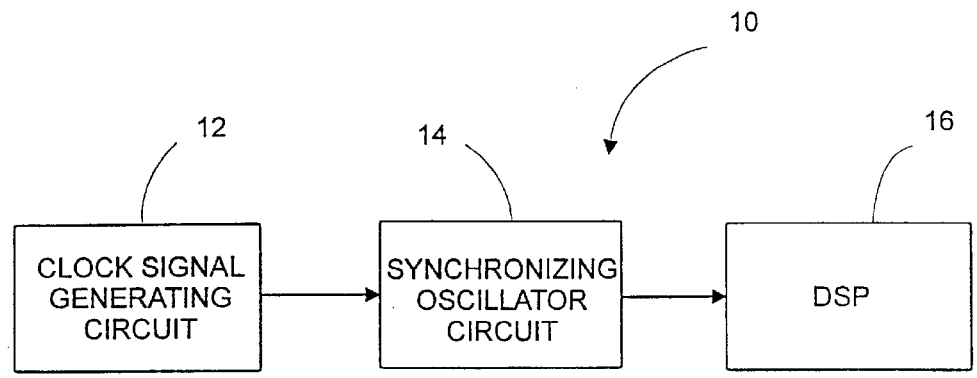
FIG. 1 is schematic block background showing the main components of the dual clock generating circuit of the present invention.

Referring now to the drawings, the dual clock generating circuit of the present invention is shown therein and indicated generally by the numeral 10. The dual clock generating circuit of the present invention includes a clock signal generating circuit 12 and a synchronizing oscillator circuit 14 that functions as a secondary clock generating circuit. The dual clock generating circuit 10 has two modes of operation—Normal mode and Reset mode. In Normal mode, the clock signal generating circuit 12 generates a first clock signal which is applied to the input of the synchronizing oscillator circuit 14. In Normal mode, the synchronizing oscillator circuit 14 passes the first clock signal essentially unchanged to the clock input of a micro-controller, microprocessor, DSP, or other controlled circuit 16 that requires a clock signal for its operation. In Reset mode, the output of the clock signal generating circuit 12 is disabled so that the input to the synchronizing oscillator circuit 14 is isolated. When isolated, the synchronizing oscillator circuit 14 behaves like an oscillator generating a second clock signal at its output.

Figure 2:
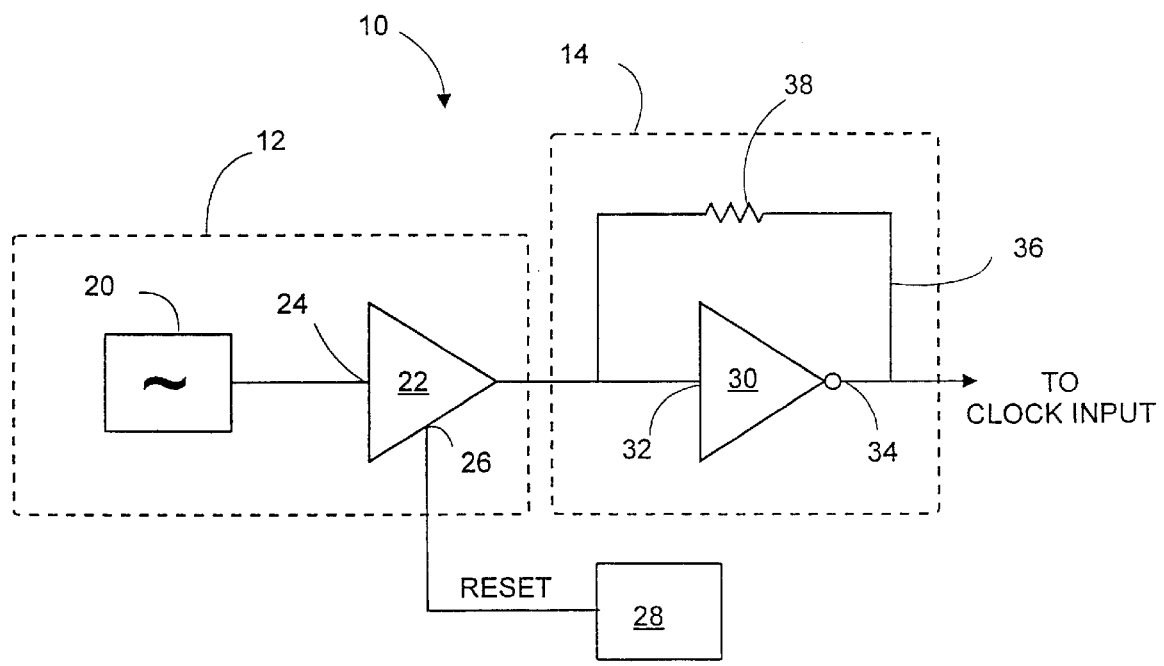
FIG. 2 is a schematic diagram showing one embodiment of the dual clock generating circuit of the present invention.

FIG. 2 illustrates one exemplary embodiment of the present invention. The clock signal generating circuit 12 comprises a clock signal generator 20 for generating the first clock signal and a tri-state buffer 22. The clock signal generator 20 may, for example, comprise an oscillator or other circuit that provides a frequency reference. The tri-state buffer 22 acts like a switch to disable or block the output of the clock generating circuit 12. The tri-state buffer 22 includes a clock signal input 24 and a control signal input 26. The clock signal input 24 is connected to the output of the clock signal generator 20. The control signal input 26 is operatively connected to a control circuit 28 that generates a control signal.

In Normal mode, the tri-state buffer 22 simply passes the clock signal produced by the clock signal generator 20 to the output of the clock signal generating circuit 12. In Reset mode, the tri-state buffer 22 blocks the clock signal produced by the clock signal generator 20. Thus, no clock signal will be present at the output of the clock signal generating circuit 12 during Reset mode.

The synchronizing oscillator circuit 14 includes an inverter 30 having an input 32 and an output 34. The input 32 of the inverter 30 is connected to the output of the clock signal generating circuit 12. The inverter output 34 is connected to the clock input of the controlled device 16. A feedback network 36 is connected between the output 34 and input 32 of the inverter 30. In the disclosed embodiment, the feedback network 36 comprises a single resistor 38, although multiple resistors could be used. In Normal mode, the resistor 38 in the synchronizing oscillator circuit 14 acts as a load on the output of the inverter 30. When the inverter input 32 is isolated, as will occur during Reset mode, the inverter 30 and the feedback network 36 form an oscillator whose frequency is controlled by the propagation delay of the inverter 30 and the RC time constant of the resistor 38 and the capacitance from the output of the buffer 22 to the input 32 of the inverter 30. The oscillation of the inverter 30 produces a second clock signal. For example, using a Toshiba TC7S14 Schmitt trigger input inverter 30 and a 40K ohm resistor 38, the frequency of the second clock signal is approximately 6.2 MHz at room temperature. The second clock signal will be present whenever the first clock signal is blocked or disabled.

While the synchronizing oscillator circuit 14 uses an inverter 30, other electrical components that generate gain could be used in place of an inverter 30. Also, other electrical components, such as capacitors, could be used in the feedback network 36 in place of or in combination with the resistor 38. However, the combination of an inverter and a resistor 38 provides a suitable signal and is inexpensive to produce.

The circuit 10 shown in FIG. 2 operates in a Normal mode when no reset signal is present at the control signal input 26 of the buffer 22, and in a Reset mode when a reset signal is present at the control signal input 26. In Normal mode, the clock signal generating circuit 12 produces a first clock signal at its output. The synchronizing oscillator circuit 14 inverts the first clock signal and passes the first clock signal essentially unchanged to the clock input of the controlled circuit 16.

In Reset mode, the output of the clock signal generating circuit 12 is disabled so that no clock signal is present at the input to the synchronizing oscillator circuit 14. When the synchronizing oscillator circuit 14 is isolated, it produces a second clock signal. The second clock signal is applied to the clock input of the controlled device 16 during reset. Thus, a clock signal for the controlled device 16 will be present even when the clock signal generating circuit 12 is disabled.

Figure 3:
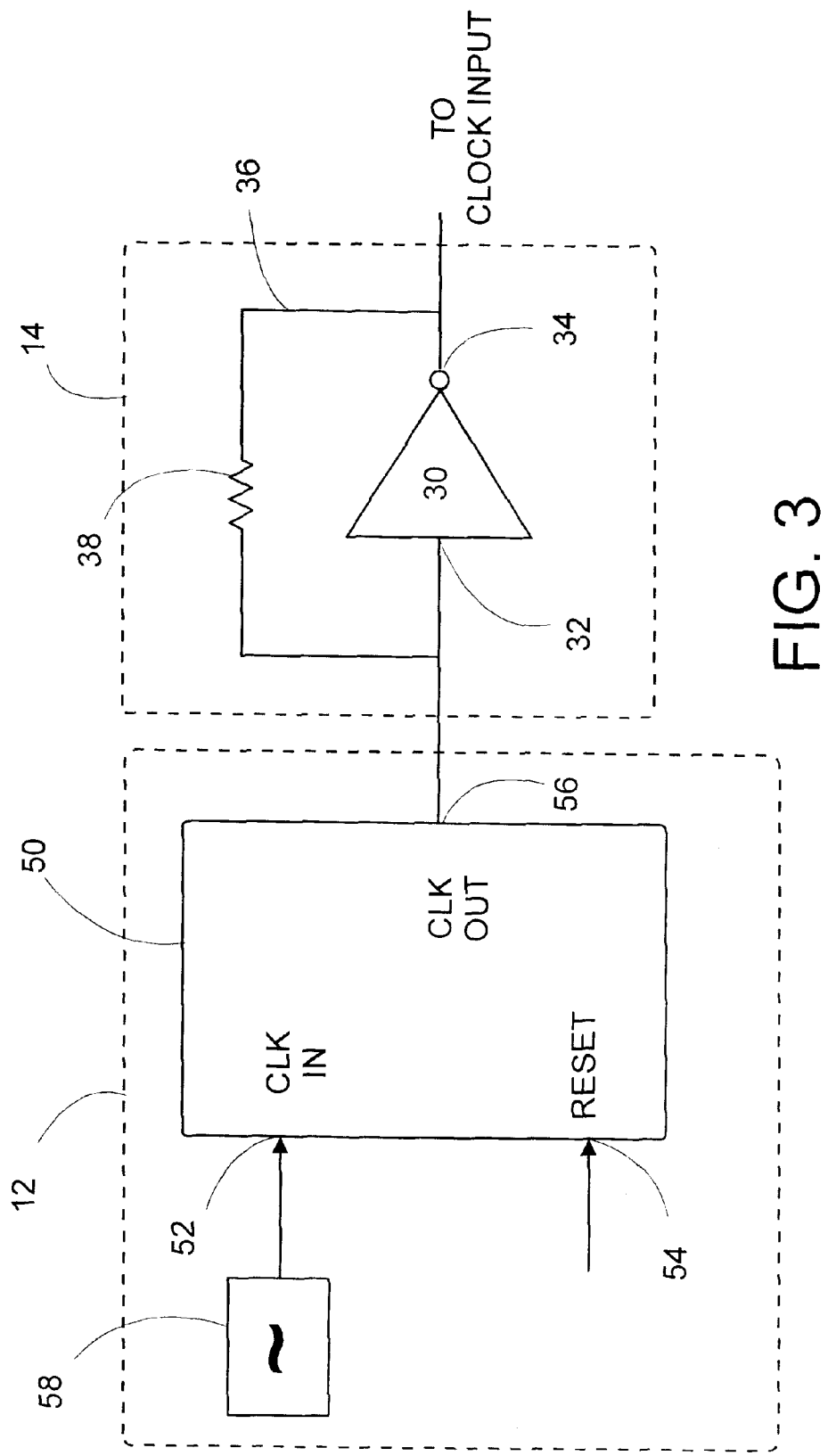
FIG. 3 is schematic diagram showing an alternate embodiment of the dual clock generating circuit of the present invention.

FIG. 3 shows an alternate embodiment of the present invention. In FIG. 3, a micro-controller 50 is used in place of the tri-state buffer 22 in the previous embodiment. The micro-controller 50 includes a clock input 52, a reset input 54, and a clock output 56. An oscillator 58 is connected to the clock input 52 of the micro-controller 50 to provide a frequency reference for the micro-controller 50. The clock output 56 is connected to the input of the synchronizing oscillator circuit 14. The signal at the clock output, which corresponds to the first clock signal, may be a divided down version of the clock at the input of the micro-controller 50. The synchronizing oscillator circuit 14 is the same as previously described.

In this embodiment, the clock output of the micro-controller 50 is disabled during reset. Thus, the input of the synchronizing oscillator circuit 14 will be isolated. The synchronizing oscillator circuit 14 then oscillates to generate a second clock signal as previously described.

Figure 4:
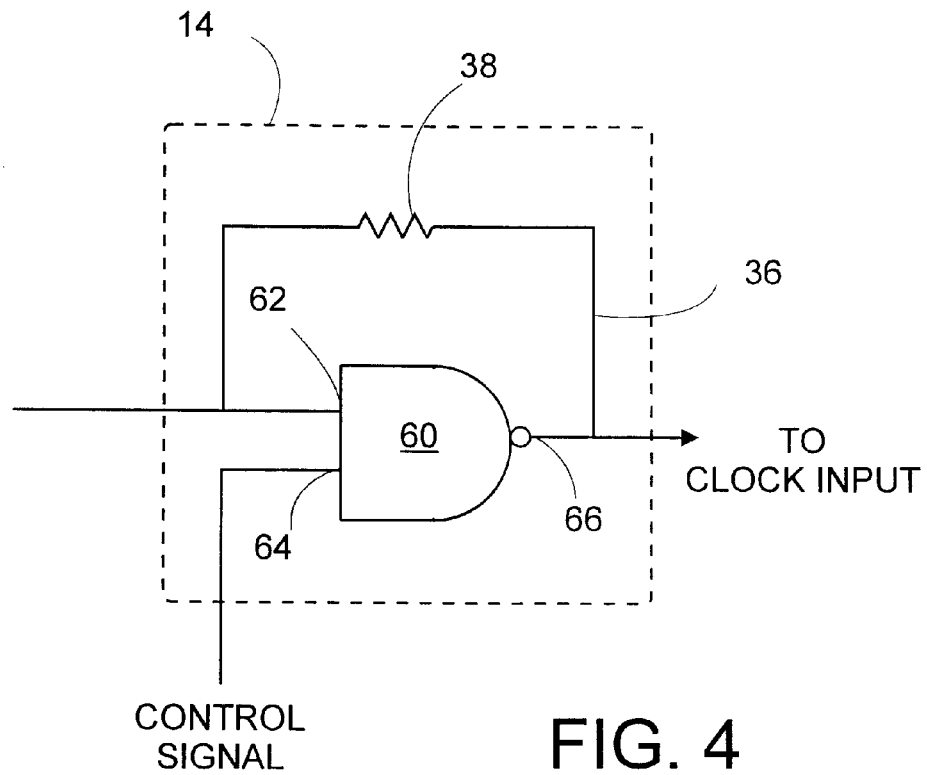
FIG. 4 is a schematic diagram showing a second embodiment of the synchronizing oscillator circuit using a NAND gate in place of the inverter.
Figure 5:
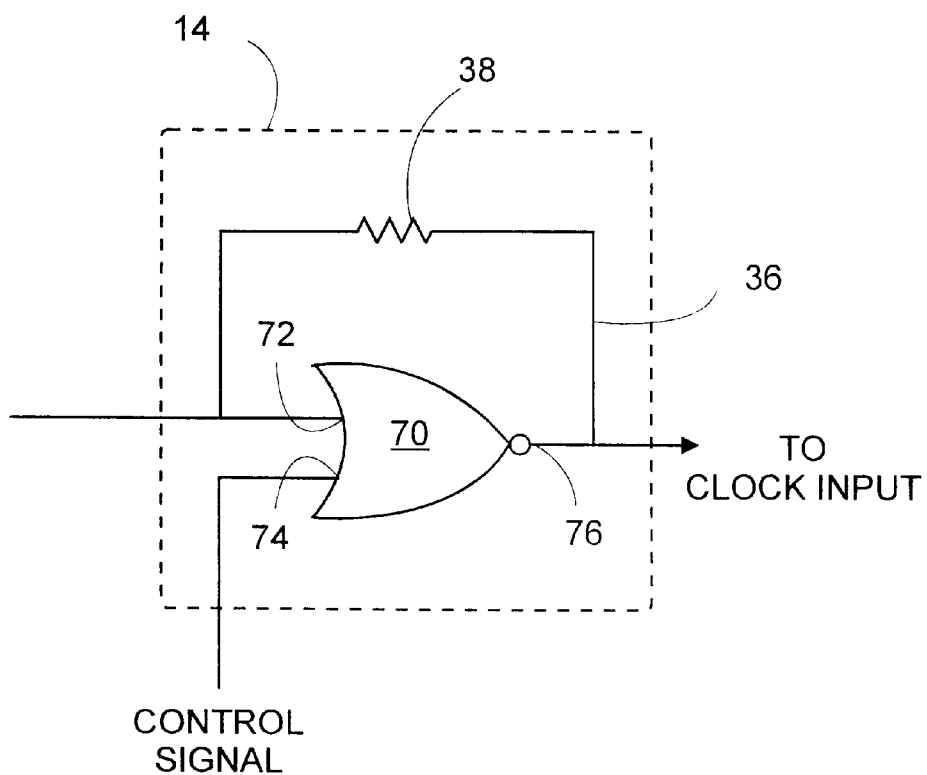
FIG. 5 is a schematic diagram showing a third embodiment of the synchronizing oscillator circuit using a NOR gate in place of the inverter.

FIGS. 4 and 5 show alternate embodiments of the synchronizing oscillator circuit 14. In the embodiments of FIGS. 4 a NAND gate is substituted for the inverter 30 in the sychronizing oscillator circuit 14. A first input of the NAND gate 60 is connected to the clock signal generator 12. A second input 64 is connected to a control signal generator. When the signal at the second input 64 is a logical high, the NAND gate functions like the inverter 30 in the previous embodiments. It passes the first clock signal essentially unchanged during Normal mode and oscillates to produce a second clock signal during Reset mode. When the signal at the second input is a logical low, the output of NAND gate will be a steady state signal, which in this example will be a logical high.

In the embodiment of FIG. 5, a NOR gate 70 is used in place of the inverter 30 of the previous embodiments. A first input of the NOR gate 60 is connected to the clock signal generator 12. A second input 74 of the NOR gate is connected to a control signal generator. When the signal at the second input 74 is a logical low, the NOR gate functions like the inverter 30 in the previous embodiments. It passes the first clock signal essentially unchanged during Normal mode and oscillates to produce a second clock signal during Reset mode. When the signal at the second input is a logical high, the output of NOR gate will be a steady state signal, which in this example will be a logical low.

The embodiments of FIGS. 4 and 5 could be useful for example to gain a greater degree of control over the clock signals. For example, the synchronizing oscillator circuit 14 could be used to disable the clock signal to a DSP or other controlled circuit 16 while the main clock is still operative. This ability might be useful for power management or other functions.

The present invention may, of course, be carried out in other specific ways than those herein set forth without departing from the spirit and essential characteristics of the invention. The present embodiments are, therefore, to be considered in all respects as illustrative and not restrictive, and all changes coming within the meaning and equivalency range of the appended claims are intended to be embraced therein.

What is claimed is:

1. A dual clock signal generating circuit comprising:
   a. a clock signal generating circuit having a clock output for producing a first clock signal at said clock output in a first operating mode, wherein no clock signal is produced at said clock output in a second operating mode;
   b. an inverter having an input connected to the clock output of said clock signal generating circuit and an output, said inverter being operative to pass said first clock signal during said first operating mode;
   d. a feedback network connected between the inverter input and the inverter output, wherein said inverter and said feedback network produces a second clock signal at said inverter output during said second operating mode.

2. The dual clock signal generating circuit according to claim 1 wherein said inverter is an inverting buffer.

3. The dual clock signal generating circuit according to claim 2 wherein said inverter is a Scmidt trigger inverter.

4. The dual clock generating circuit according to claim 1 wherein said inverter includes at least one logic gate.

5. The dual clock generating circuit according to claim 4 wherein said logic gate is a NAND gate.

6. The dual clock generating circuit according to claim 4 wherein said logic gate is a NOR gate.

7. The dual clock signal generating circuit according to claim 1 wherein said clock signal generating circuit comprises an oscillator for generating said first clock signal, and a tri-state buffer operatively connected to said clock signal generator, wherein said tri-state buffer is operative to pass said first clock signal to said inverter input during said first operating mode and to block said first clock signal during said second operating mode.

8. The dual clock signal generating circuit according to claim 1 wherein said clock signal generating circuit comprises a micro-controller having a clock input and a clock output, and an oscillator connected to the clock input of said micro-controller, wherein said microcontroller produces said first clock signal at its clock output during said first operating mode.

9. A dual clock signal generating circuit comprising:
   a. a clock signal generating circuit having a clock output for generating a first clock signal at said clock output;
   b. a buffer having an input connected to the clock output of said clock signal generating circuit and an output, said buffer being operative to pass said first clock signal during a first operating mode and to block said first clock signal during a second operating mode;
   c. an inverter having an input connected to said buffer output and an output, said inverter being operative to pass said first clock signal during said first operating mode;
   d. a feedback network connected between the inverter input and the inverter output so as to produce a second clock signal at said inverter output in said second operating mode.

10. The dual clock signal generating circuit according to claim 9 wherein said inverter is an inverting buffer.

11. The dual clock signal generating circuit according to claim 10 wherein said inverter is a Schmitt trigger inverter.

12. The dual clock generating circuit according to claim 9 wherein said inverter includes at least one logic gate.

13. The dual clock generating circuit according to claim 12 wherein said logic gate is a NAND gate.

14. The dual clock generating circuit according to claim 12 wherein said logic gate is a NOR gate.

15. A dual clock signal generating circuit comprising:
   a. a micro-controller having a clock output for generating a first clock signal, said micro-controller having a first operating mode wherein a first clock signal is generated at said clock output, and a second operating mode wherein no clock signal is produced at said clock output;
   b. an oscillating circuit connected to said clock output of said micro-controller for passing said first clock signal in said first operating mode and for generating a second clock signal in said second operating mode.

16. The dual clock signal generating circuit according to claim 15 wherein said oscillating circuit includes an inverter having an input connected to the clock output of said micro-controller and an output, and a feedback network connected between said inverter input and said inverter output.

17. The dual clock signal generating circuit according to claim 16 wherein said inverter is an inverting buffer.

18. The dual clock signal generating circuit according to claim 17 wherein said inverter is a Schmitt trigger inverter.

19. The dual clock generating circuit according to claim 16 wherein said inverter includes at least one logic gate.

20. The dual clock generating circuit according to claim 19 wherein said logic gate is a NAND gate.

21. The dual clock generating circuit according to claim 19 wherein said logic gate is a NOR gate.

22. A dual clock signal generating circuit comprising:
   a. a clock signal generating circuit having a clock output for generating a first clock signal at said clock output during a first operating mode, wherein said first clock signal is not present at said clock output during a second mode of operation;

b. a secondary clock generating circuit connected in series with said clock signal generating circuit, wherein said secondary clock generating circuit passes said first clock signal during said first operating mode and generates a second clock signal during said second operating mode.

23. The dual clock signal generating circuit according to claim 22 wherein said secondary clock generating circuit includes an inverter having an input connected to the clock output of the clock generating circuit and output, and a feedback network connected between the inverter input and the inverter output.

24. The dual clock signal generating circuit according to claim 23 wherein said feedback network includes at least one resistor.

25. A method for generating a secondary clock signal when a primary clock signal is suppressed, comprising:

a. generating a primary clock signal in a primary clock generating circuit;

b. inputting said primary clock signal to a secondary clock generating circuit;

c. outputting said primary clock signal from the secondary clock generating circuit during a first operating mode;

d. generating a secondary clock signal in said secondary clock generating circuit during a second operating mode; and e. outputting said secondary clock signal during said second operating mode.

* * * * *